United States Patent
Liang

(10) Patent No.: US 9,958,142 B2
(45) Date of Patent: May 1, 2018

(54) LED LAMP BEADS WITH MULTIPLE LIGHT-EMITTING POINTS

(71) Applicant: DONGGUAN CHEN CAI ILLUMINATING TECHNOLOGY CO., LTD, Dongguan (CN)

(72) Inventor: Faquan Liang, Dongguan (CN)

(73) Assignee: DONGGUAN CHEN CAI ILLUMINATING TECHNOLOGY CO., LTD, Dongguan (CN)

( * ) Notice: Subject to any disclaimer, the term of this patent is extended or adjusted under 35 U.S.C. 154(b) by 103 days.

(21) Appl. No.: 14/975,233

(22) Filed: Dec. 18, 2015

(65) Prior Publication Data

US 2017/0167698 A1    Jun. 15, 2017

(30) Foreign Application Priority Data

Dec. 9, 2015    (CN) .......................... 2015 1 0899222

(51) Int. Cl.
*F21V 19/00*  (2006.01)
*H05B 33/06*  (2006.01)
*F21Y 115/10*  (2016.01)

(52) U.S. Cl.
CPC .......... *F21V 19/002* (2013.01); *H05B 33/06* (2013.01); *F21Y 2115/10* (2016.08)

(58) Field of Classification Search
CPC .............................. F21V 19/002; H05B 33/06
See application file for complete search history.

(56) References Cited

U.S. PATENT DOCUMENTS

2006/0215422 A1* 9/2006 Laizure, Jr. ........... F21V 31/005
362/650

* cited by examiner

*Primary Examiner* — Anne Hines
(74) *Attorney, Agent, or Firm* — Ming Chow; Sinorica, LLC

(57) ABSTRACT

LED lamp beads with multiple light-emitting points comprising a certain number of luminous bodies and package resins; in which after at least two luminous bodies are connected in parallel, they are wrapped in a package resin and connected to an anode pin and a cathode pin inserted into the package resin. The present invention structure is simple and has a rational design. By using one-way conductive luminance on the LED luminous bodies, and using parallel and inverse parallel connections on multiple light-emitting points, control of the electric current direction is achieved, and thus the control of the operating modes of luminous bodies and the LED lamp beads with multiple light-emitting points is achieved.

6 Claims, 2 Drawing Sheets

LED LAMP BEADS WITH MULTIPLE LIGHT-EMITTING POINTS

The current application claims a foreign priority to application number 201510899222.6 filed on Dec. 9, 2015 in China.

FIELD OF THE INVENTION

The present invention relates to LED lamp beads, and particularly relates to LED lamp beads which have a plurality of light-emitting points within a single enclosure body.

DESCRIPTION OF THE RELATED ART

The prior art LED lamp beads generally comprise only a single light-emitting point, have limited function, and can only switch between two states, which are the bright and the dark states. At the same time, the level of illumination and the angle of illumination of a single LED lamp bead are limited. It has only one function. LED lamp beads do not have the function of adjustable light colours. As a result, when LEDs are to be used for high level of illumination and various colours are desired to be obtained, it is not possible to use a single LED lamp bead. Using a plurality of different colours of LED beads would be required for this purpose.

SUMMARY OF THE INVENTION

The purpose of the present invention is to overcome the prior art LED lamp beads with single light-emitting points, and provide LED lamp beads with multiple light-emitting points.

In order to achieve the above said purpose, the technical proposal used by the present invention is as follows: LED lamp beads with multiple light-emitting points comprising a certain number of luminous bodies and package resins; and after at least two luminous bodies are connected in parallel, they are wrapped in a package resin and connected to an anode pin and a cathode pin inserted into the package resin.

Preferably, the luminous bodies all comprise LED luminous microchips.

Alternatively, the luminous bodies are SMD (surface mount device) light emitting diodes.

Preferably, after the anode port of a luminous body and the anode port of its adjacent luminous body are connected, they receive the anode pin, and the cathode port of the luminous body and the cathode port of the adjacent luminous body receive the cathode pin.

Alternatively, after the cathode port of a luminous body and the anode port of its adjacent luminous body are connected, they receive the anode pin, and the anode port of the luminous body and the cathode port of the adjacent luminous body receive the cathode pin.

Preferably, the package resin is a colourless transparent resin.

Alternatively, the package resin is a single colour resin.

Alternatively, the package resin has a multi-colour structure with multiple layers.

The present invention structure is simple and has a rational design. By using one-way conductive luminance on the LED luminous bodies, and using parallel and inverse parallel connections on multiple light-emitting points, control of the electric current direction is achieved, and thus the control of the operating modes of luminous bodies and the LED lamp beads with multiple light-emitting points is achieved.

DETAILED DESCRIPTION OF THE PREFERRED EMBODIMENTS

In order to understand the present invention better, embodiments and relevant Figures are provided for detailed description of the present invention.

Embodiment 1

Figure 1:
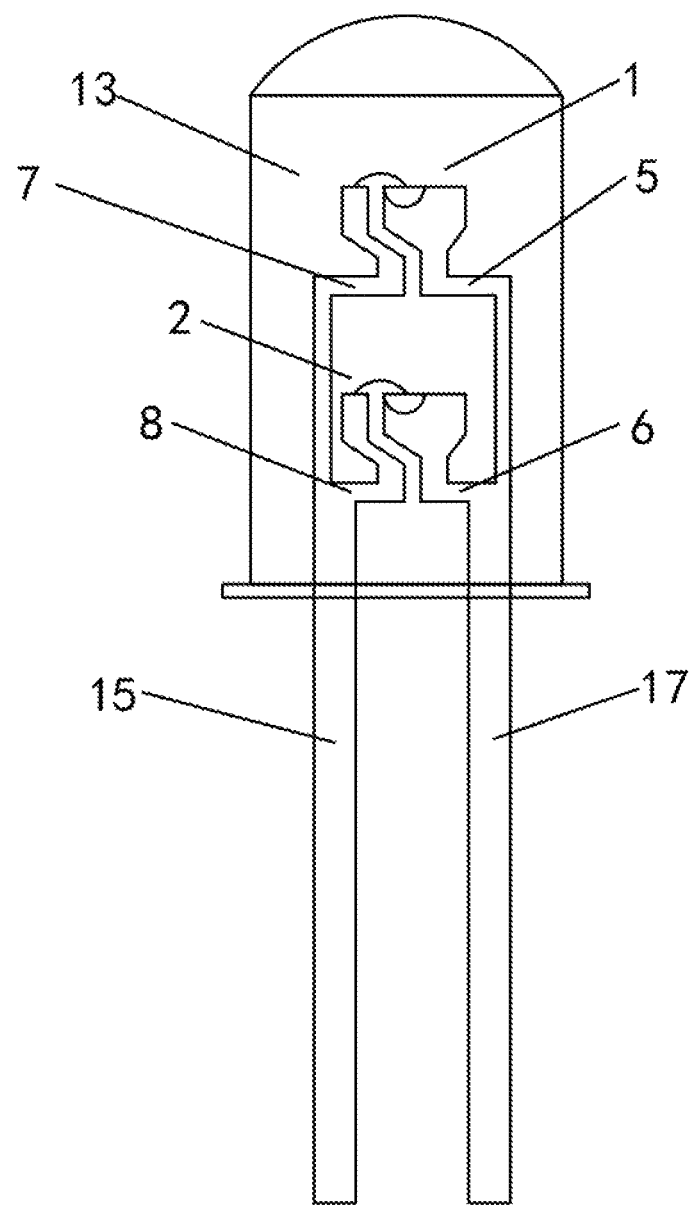
FIG. 1 is a view of a first embodiment structure.

As shown in FIG. 1, the present invention comprises two luminous bodies 1, 2 and a package resin 5; and after the at least two luminous bodies 1, 2 are connected in parallel, they are wrapped in a package resin 5 and connected to an anode pin 7 and a cathode pin 9 inserted into the package resin 5; the luminous bodies 1, 2 are LED luminous microchips; after the anode port of a luminous body 1 and the anode port of its adjacent luminous body 2 are connected, they receive the anode pin 7, and the cathode port of the luminous body 1 and the cathode port of the adjacent luminous body 2 receive the cathode pin 9; and the package resin 5 is a colourless transparent resin.

Embodiment 2

Figure 2:
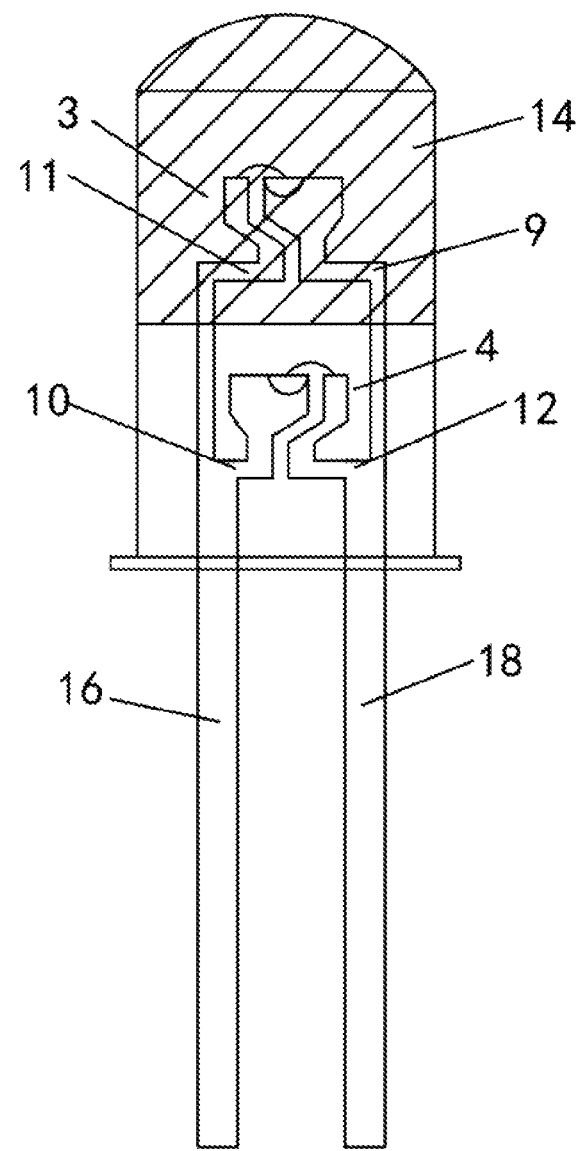
FIG. 2 is a view of a second embodiment structure.

As shown in FIG. 2, the present invention comprises two luminous bodies 3, 4 and a package resin 6; and after the at least two luminous bodies 3, 4 are connected in parallel, they are wrapped in a package resin 6 and connected to an anode pin 8 and a cathode pin 10 inserted into the package resin 6; the luminous bodies 3, 4 are SMD (surface mount device) light emitting diodes; and after the cathode port of a luminous body 4 and the anode port of its adjacent luminous body 3 are connected, they receive the anode pin 8, and the anode port of the luminous body 4 and the cathode port of the adjacent luminous body 3 receive the cathode pin 10; and the package resin 6 has a two-colour structure with two layers.

What is claimed is:
1. An LED lamp bead comprising:
a first luminous body;
a second luminous body;
an anode pin;
a cathode pin;
a package resin;
the first luminous body and the second luminous body being wrapped in the package resin;
the first luminous body and the second luminous body being electrically coupled with each other in parallel;
the anode pin and the cathode pin being inserted into the package resin;
the first luminous body and the second luminous body each being electrically coupled with the anode pin and the cathode pin;
the first luminous body comprising a first anode port and a first cathode port;
the second luminous body comprising a second anode port and a second cathode port;
the first anode port, the second cathode port and the anode pin being electrically coupled with one another; and
the first cathode port, the second anode port and the cathode pin being electrically coupled with one another.

2. The LED lamp bead of claim 1 comprising:
the first luminous body and the second luminous body each comprising an LED luminous microchip.
3. The LED lamp bead of claim 1 comprising:
the first luminous body and the second luminous body each comprising a SMD (surface mount device) light emitting diode.
4. The LED lamp bead of claim 1 comprising:
the package resin being a colourless transparent resin.
5. The LED lamp bead of claim 1 comprising:
the package resin being a single-colour resin.
6. The LED lamp bead of claim 1 comprising:
the package resin being a multi-colour resin.

* * * * *